United States Patent
Katpelly et al.

(10) Patent No.: US 9,172,117 B2
(45) Date of Patent: Oct. 27, 2015

(54) USER-CONTROLLED APPLICATION-BASED POWER MANAGEMENT

(75) Inventors: Ravi Reddy Katpelly, Durham, NC (US); Christopher M. Amidon, Apex, NC (US); Hugh Svendsen, Chapel Hill, NC (US)

(73) Assignee: Domingo Enterprises, LLC, Wilmington, DE (US)

( * ) Notice: Subject to any disclaimer, the term of this patent is extended or adjusted under 35 U.S.C. 154(b) by 956 days.

(21) Appl. No.: 12/327,848

(22) Filed: Dec. 4, 2008

(65) Prior Publication Data

US 2010/0145643 A1   Jun. 10, 2010

(51) Int. Cl.
 *G01R 31/36* (2006.01)
 *H01M 10/48* (2006.01)
 *G06F 1/32* (2006.01)
 (Continued)

(52) U.S. Cl.
 CPC .............. *H01M 10/48* (2013.01); *G06F 1/3203* (2013.01); *G06F 1/329* (2013.01); *H01M 10/44* (2013.01); *H04W 52/0258* (2013.01); *H04W 52/0264* (2013.01); *G01R 31/3693* (2013.01); *Y02B 60/144* (2013.01)

(58) Field of Classification Search
 CPC ... G01R 31/36; Y02T 10/7005; H02J 7/1438; H02J 7/00; H02J 9/002; H04W 52/0277; G06F 19/00; G06F 1/26; G06F 9/40
 USPC ......... 702/63, 57, 60–62, 64–65, 81, 84, 127, 702/181–184, 188–189; 320/127, 134, 136; 340/636.1, 636.12–636.13, 636.15, 340/636.16, 636.19; 327/530, 544; 429/90, 429/428; 700/9, 11–12, 17, 21–22, 700/108–109, 286, 291, 295, 297
 See application file for complete search history.

(56) References Cited

U.S. PATENT DOCUMENTS

| 5,532,935 A | 7/1996 | Ninomiya et al. |
| 6,590,730 B2 | 7/2003 | Veltchev et al. |
| 6,710,578 B1 | 3/2004 | Sklovsky |

(Continued)

FOREIGN PATENT DOCUMENTS

JP   2006-229340 A2   8/2006

OTHER PUBLICATIONS

"Apple—iPhone—View all the features of the new iPhone 3GS," http://www.apple.com/iphone/iphone-3gs/, printed Aug. 11, 2009, 5 pages.

(Continued)

*Primary Examiner* — Toan Le

(57) ABSTRACT

A user-controlled application-based power management function is provided for a battery-operated device. In general, for each of a number of applications of the battery-operated device, a power management function enables a user of the battery-operated device to provide a usage parameter for the application defining a desired amount of usage of the application for each of one or more tasks. For each task, the power management function determines an estimated amount of battery life that is sufficient to provide the desired amount of usage of the application for the task and determines whether the estimated amount of battery life is available. If the estimated amount of battery life is available, the power management function allocates an amount of battery life corresponding to the estimated amount of battery life to the application for the task.

32 Claims, 8 Drawing Sheets

(51) Int. Cl.
*H01M 10/44* (2006.01)
*H04W 52/02* (2009.01)

(56) References Cited

U.S. PATENT DOCUMENTS

| | | | |
|---|---|---|---|
| 6,834,354 | B1 | 12/2004 | Togawa |
| 7,227,847 | B2 | 6/2007 | Gluck |
| 7,260,728 | B2 | 8/2007 | Chang et al. |
| 7,363,519 | B2 | 4/2008 | Liebenow |
| 2004/0041538 | A1* | 3/2004 | Sklovsky ................ 320/127 |
| 2007/0004467 | A1 | 1/2007 | Chary |
| 2008/0186086 | A1* | 8/2008 | Bell ............................ 327/544 |
| 2008/0201587 | A1 | 8/2008 | Lee |

OTHER PUBLICATIONS

"Apple—iPod Touch—Features," http://www.apple.com/ipodtouch/features/, printed Aug. 13, 2009, 2 pages.

Karthick Rajamani et al., "Application-Aware Power Management," 2006 IEEE International Symposium on Workload Characterization, pp. 39-48, Oct. 25-27, 2006, 10 pages.

* cited by examiner

| Back | Task List | Save |
|---|---|---|
| Priority Level | Task | Cost |
| 1. | iPod | Low |
| 2. | Talk | High |
| 3. | Talk | High |
| 4. | Camera | Medium |
| 5. | iPod | Medium |
| 6. | Video | Medium |

FIG. 5A

| Back | Task List | Save |
|---|---|---|
| Priority Level | Task | Cost |
| 1. | Talk | High |
| 2. | iPod | Low |
| 3. | Talk | High |
| 4. | Camera | Medium |
| 5. | iPod | Medium |
| 6. | Video | Medium |

FIG. 5B

USER-CONTROLLED APPLICATION-BASED POWER MANAGEMENT

FIELD OF THE INVENTION

The present invention relates to power management for a battery-operated device, and more specifically relates to application-based power management for a battery-operated device.

BACKGROUND OF THE INVENTION

Users of battery-operated devices, such as mobile smart phones, frequently experience low-battery issues. Some currently available battery-operated devices enable a user to check remaining battery life, where the remaining battery life is presented as a percentage of a maximum battery life. The user may then manually adjust device options to reduce power consumption if desired. However, this type of manual power management scheme is not intuitive and practical for the average user. As such, there is a need for an improved power management scheme for battery operated devices.

SUMMARY OF THE INVENTION

The present invention relates to user-controlled application-based power management for a battery-operated device. In general, for each of a number of applications of the battery-operated device, a power management function enables a user of the battery-operated device to provide a usage parameter for the application defining a desired amount of usage of the application for each of one or more tasks. For each task for each application, the power management function determines an estimated amount of battery life that is sufficient to provide the desired amount of usage of the application for the task and determines whether the estimated amount of battery life is available. If the estimated amount of battery life is available, the power management function allocates an amount of battery life corresponding to the estimated amount of battery life for the application for the task. The power management function may then monitor usage of the applications and/or battery usage and take action(s) based thereon. For example, the power management function may provide notifications to the user and/or terminate use of applications based on the battery life allocated to the tasks for the applications.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 5A and 5B illustrate an exemplary GUI showing a task list that enables the user to prioritize tasks according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
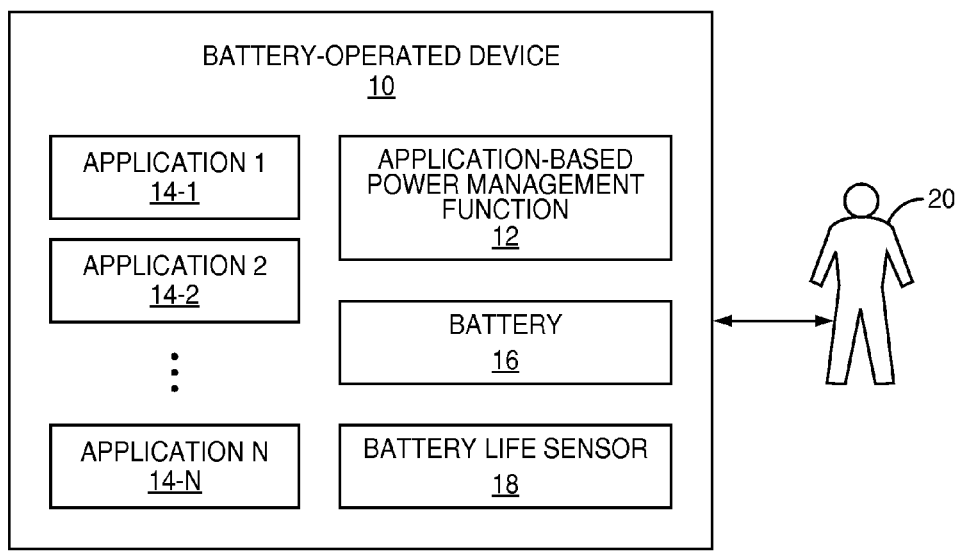
FIG. 1 is a functional block diagram of a battery-operated user device including an application-based power management function according to one embodiment of the present invention.

FIG. 1 illustrates a battery-operated device 10 incorporating a user-controlled application-based power management function 12 (hereinafter referred to as "power management function 12") according to one embodiment of the present invention. The battery-operated device 10 may be any type of device that is powered by one or more batteries full-time or part-time. For example, the battery-operated device 10 may be a mobile smart phone such as an Apple iPhone or a Blackberry mobile device, a notebook computer, a Personal Digital Assistant (PDA), a portable media player such as an Apple iPod Touch®, or the like.

In general, the battery-operated device 10 includes the power management function 12, a number of applications 14-1 through 14-N, a battery 16, and a battery life sensor 18. In addition, the battery-operated device 10 is associated with a user 20. The power management function 12 is preferably implemented in software. However, the present invention is not limited thereto. The power management function 12 may be implemented in software, hardware, or a combination thereof. As discussed below in detail, the power management function 12 enables the user 20 to provide usage parameters for one or more of the applications 14-1 through 14-N that define a desired amount of usage of the one or more applications. Further, the user 20 may be enabled to define multiple usage parameters for multiple tasks for the same application. Based on the usage parameters, the power management function 12 operates to allocate or reserve a sufficient amount of battery life for the one or more applications to provide the desired amount of usage.

The applications 14-1 through 14-N may be any type of applications provided by the battery-operated device 10. For example, if the battery-operated device 10 is an Apple iPhone, the applications 14-1 through 14-N may include a mobile telephone application, a media player or iPod application, an Internet browser application, etc. As another example, if the battery-operated device 10 is a notebook computer, the applications 14-1 through 14-N may include a media player application, an Internet browser application, a word processing application, a game or gaming application, or the like. Note that the types of applications 14-1 through 14-N provided by the battery-operated device 10 may vary depending on the type of battery-operated device 10.

The battery 16 may be any type of battery used to power a device. For example, the battery 16 may be a Lithium Ion battery. However, the present invention is not limited thereto. The battery life sensor 18 may be implemented in software, hardware, or a combination thereof and generally operates to estimate battery life of the battery 16. More specifically, at any given time, the battery life sensor 18 operates to estimate a battery life of the battery 16. For example, the battery life sensor 18 may estimate the battery life of the battery 16 as a percentage of a maximum battery life of the battery 16.

Figure 2:
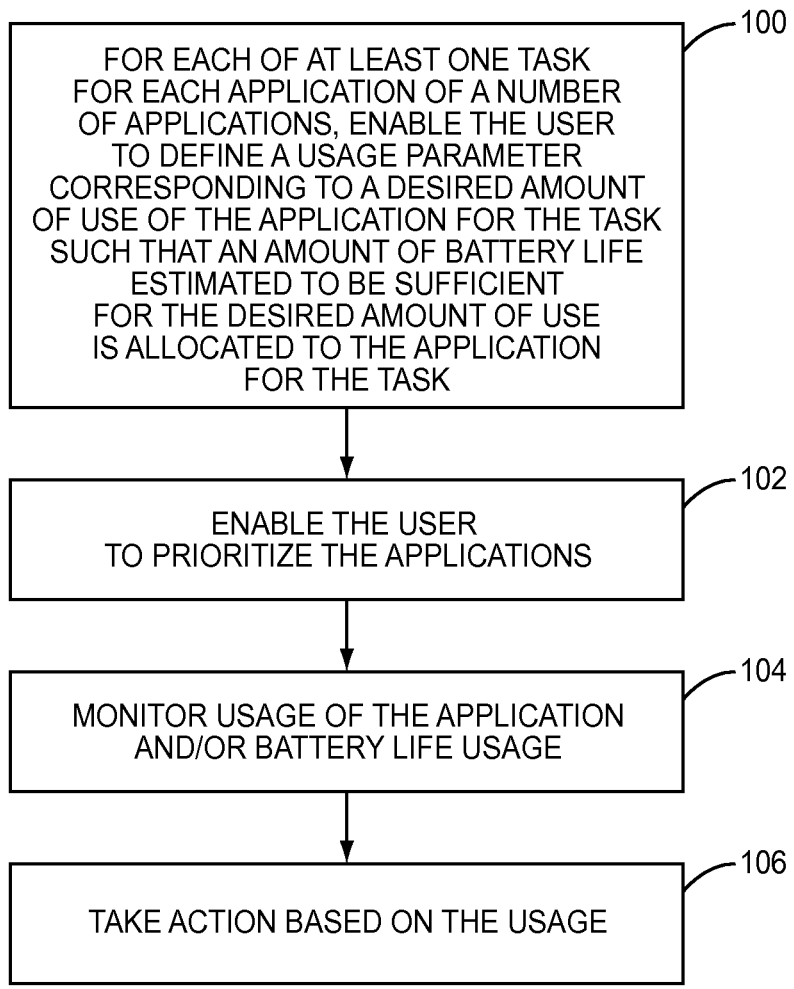
FIG. 2 is a flow chart illustrating the operation of the application-based power management function of FIG. 1 according to one embodiment of the present invention.

FIG. 2 is a flow chart illustrating the operation of the power management function 12 of the battery-operated device 10 according to one embodiment of the present invention. First, for each application of a number of the applications 14-1 through 14-N, the power management function 12 enables the user 20 to define a usage parameter corresponding to a desired amount of usage of the application for each of one or more tasks such that, for each task, an amount of battery life estimated to be sufficient for the desired amount of usage is allocated for the application for the task (step 100). Note that the user 20 may define usage parameters for one or more tasks for all of the applications 14-1 through 14-N or for one or more tasks for any one or more of the applications 14-1 through 14-N. For this example, the user 20 defines usage parameters for one or more tasks for all of the applications 14-1 through 14-N. Using a mobile phone application as a first example, the usage parameter may be a desired amount of talk time. The desired amount of talk time may be defined in, for example, minutes. As such, for each task for the mobile phone application, an amount of battery life needed for the desired amount of talk time for the task is estimated and allocated, or reserved, for the mobile phone application. Using a media player application as a second example, the usage parameter may be a desired amount of audio or video playback time or a desired number of media items (e.g., songs, videos, or the like) desired to be played. As such, for each task for the media player application, an amount of battery life needed for the desired amount of audio or video playback time for the task is estimated and allocated for the media player application. Using a camera application as a third example, the usage parameter may be a desired number of pictures and, optionally, a desired quality level. As such, for each task for the camera application, an amount of battery life needed for the desired number of pictures and, optionally, at the desired quality level for the task is estimated and allocated to the camera application. Using a web application as a final example, the usage parameter may be a desired amount of connectivity of the web application. The web application may be an Internet browser, an email application, or the like. The desired amount of connectivity may be, for example, a desired amount of time (e.g., 10 minutes) or a desired amount of data (e.g., 10 megabytes (MB)). As such, for each task for the web application, an amount of battery life needed for the desired amount of connectivity for the task is estimated and allocated for the web application. While defining the usage parameters for the tasks for the applications 14-1 through 14-N in step 100 and/or after defining the usage parameters for tasks for the applications 14-1 through 14-N in step 100, the user 20 may also be enabled to prioritize the tasks for the applications for which usage parameters are defined (step 102).

Once the usage parameters for the tasks for the applications 14-1 through 14-N are defined and tasks for the one or more applications 14-1 through 14-N are prioritized, the power management function 12 monitors actual usage of the applications 14-1 through 14-N and/or usage of the battery life of the battery 16 (step 104). The power management function 12 then takes action based on the monitored usage (step 106). More specifically, in one embodiment, the power management function 12 monitors the usage of each of the applications 14-1 through 14-N for which usage parameters have been defined. The power management function 12 may then notify the user 20 when a total desired amount of usage for all tasks for an application has been consumed or is about to be consumed or when the desired amount of usage for a task for an application has been consumed or is about to be consumed. For example, if the user 20 has defined a usage parameter of 20 minutes for a task for a media player application, the power management function 12 may monitor usage of the media player application and notify the user 20 once the user 20 has consumed 20 minutes of use of the media player application. In addition or alternatively, the power management function 12 may monitor usage of the media player application and notify the user 20 once the user 20 has consumed a threshold amount of the 20 minutes of use of the media player application. For example, the threshold may be 90% of the desired amount of usage, which in this example would be 18 minutes. Once the user 20 is notified, the user 20 may choose to terminate usage of the application or continue usage of the application.

Note that in the event that the user 20 chooses to continue using an application after he has received notification that the desired amount of usage of the application for a task has been consumed, the amount of battery life allocated for tasks for the same application and/or other applications may be affected. For instance, if there is no non-allocated battery life or if the battery life needed for the additional usage of the application exceeds the non-allocated battery life, the battery life allocated to lower priority tasks may be reduced in order to compensate for the additional usage of the application. As a result, the usage parameters for the affected lower priority tasks may also be reduced to reflect the reduction in allocated battery life. In addition or alternatively, the usage of the applications for the affected lower priority tasks may be optimized in order to compensate for the reduction in the allocated battery life for the affected lower priority tasks. The manner in which the applications for the lower priority tasks may be optimized may vary depending on the type of application. Specific examples of optimizations for exemplary applications are discussed below.

If there are no lower priority tasks or if the battery life needed for the additional usage of the application exceeds non-allocated battery life and the battery life allocated to all lower priority tasks, the battery life allocated to higher priority tasks may be reduced. The battery life allocated to the higher priority tasks may be reduced in a distributed manner such that, for example, the battery life needed for the additional usage of the application is taken from the battery life allocated to the higher priority tasks on a per capita basis, on a percentage basis, or the like. Alternatively, the battery life allocated to the higher priority tasks may be reduced starting with the battery life allocated to the next highest priority task. As a result of the reduction in the battery life allocated to the affected higher priority tasks, the usage parameters of the affected higher priority tasks may also be reduced to reflect the reduction in allocated battery life. In addition or alternatively, the usage of the applications for the affected higher priority tasks may be optimized in order to compensate for the reduction in the allocated battery life for the affected higher priority tasks. The manner in which the applications for the higher priority tasks may be optimized may vary depending on the type of application. Again, specific examples of optimizations for exemplary applications are discussed below.

In addition to or as an alternative to notifying the user 20 when the desired amount of usage of a task for an application has been consumed or is about to be consumed, the power management function 12 may notify the user 20 when the use of an application is infringing or is about to infringe on the battery life allocated to a task for another application and/or a task for the same application. In this case, the power management function 12 may monitor the applications 14-1 through 14-N for which battery life has been allocated and, optionally, other applications for which battery life has not been allocated. An application may be about to infringe the battery life allocated to a task if, for example, the application is within a threshold number of percentage points from starting to consume battery life allocated to a task, the application is expected to start consuming battery life allocated to a task within a defined amount of time, or the like. In one embodiment, the user 20 is notified only when the use of an application is infringing or is about to infringe on the battery life allocated to a higher priority task. In another embodiment, the user 20 is notified when the use of an application is infringing or is about to infringe on the battery life allocated to either a lower or higher priority task. In response to the notification, the user 20 may choose to continue use of the application or to terminate use of the application. If the user 20 chooses to continue use of the application, the battery life allocated for the task whose battery life is infringed upon or is about to be infringed upon is reduced. As a result, the usage parameter of that task may also be reduced in order to reflect the reduction in allocated battery life. In addition or alternatively, the usage of the application for the task may be optimized in order to compensate for the reduction in the allocated battery life for the task.

In an alternative embodiment, the power management function 12 may automatically terminate usage of an application when the desired amount of usage for the task or the combined desired amount of usage for all tasks of that application has been consumed by the user 20. The power management function 12 may then prohibit use of the application until the user 20 defines a usage parameter for a new task for the application to allow additional usage, until the battery 16 has been recharged, or until non-allocated battery life becomes available by, for example, the reduction of the usage parameters of one or more tasks for one or more other applications by the user 20.

In another alternative embodiment, the power management function 12 may automatically terminate usage of an application when the use of the application is infringing or is about to infringe on the battery life allocated to a task of another application. This is regardless of whether the task has been assigned a higher or lower priority than the current task. Note that in this embodiment, the use of an application is not terminated as long as there is non-allocated battery life available for use by the application. The power management function 12 may then prohibit use of the application until the user 20 reduces the usage parameters for one or more tasks and, optionally, defines a usage parameter for a new task for the application or increases the usage parameter for the current task for the application, until the battery 16 has be recharged, or until non-allocated battery life becomes available.

In yet another alternative embodiment, the power management function 12 may automatically terminate usage of an application when the use of the application is infringing or is about to infringe on the battery life allocated to a higher priority task. Note that in this embodiment, the use of an application is not terminated as long as there is remaining non-allocated battery life or remaining battery life allocated to lower priority tasks that can be used by the application. The power management function 12 may then prohibit use of the application until the user 20 reduces the usage parameters for one or more higher priority tasks and increases the usage parameter of the current task for the application or defines a usage parameter for a new task for the application, until the user 20 increases the priority of the current task of the application such that any remaining battery life allocated to lower priority tasks then becomes available to the application, until the battery 16 has been recharged, or until non-allocated battery life becomes available.

In addition to or as an alternative to providing the notifications to the user 20 and/or automatically terminating applications based on the monitored usage, the power management function 12 may update the amount of battery life allocated to the tasks for the applications 14-1 through 14-N based on the amount of battery life actually consumed by the applications 14-1 through 14-N during operation. More specifically, the amount of battery life allocated to each of tasks for the applications 14-1 through 14-N is estimated based on the usage parameter defined by the user 20 for that task as well as a battery usage characteristic of the corresponding application. The battery usage characteristic of the application may vary depending on the type of application. For example, if the application is a media player, the battery usage characteristic may define an amount of battery usage per minute of audio playback time and/or an amount of battery usage per minute of video playback time. As another example, if the application is a camera application, the battery usage characteristic may define an amount of battery usage per image capture operation and, optionally, at each of a number of image quality levels. The battery usage characteristics of the applications 14-1 through 14-N may be updated based on present and/or past monitored battery life consumption of the applications 14-1 through 14-N during actual use. Then, based on the updated battery usage characteristics and the usage parameters for the applications 14-1 through 14-N, the amount of battery life allocated for each of the tasks for the applications 14-1 through 14-N is updated. If necessary, the updated amounts of battery life allocated to one or more of the tasks for the applications 14-1 through 14-N may be reduced such that the total allocated battery life is less than a maximum allowable battery life. In one embodiment, the maximum allowable battery life is the remaining battery life of the battery 16 when the user 20 initially defined the usage parameters for the tasks for the applications 14-1 through 14-N. However, the present invention is not limited thereto. Then, as discussed above, the usage parameters of the affected tasks may also be reduced and/or the usage of the applications for the affected tasks may be optimized in order to compensate for the reduction in allocated battery life.

In addition to or as an alternative to providing the notifications to the user 20 and/or terminating applications, based on the monitored use of the applications 14-1 through 14-N and the corresponding battery consumption of the applications 14-1 through 14-N, the power management function 12 may automatically optimize the usage of the applications 14-1 through 14-N such that the usage of the applications 14-1 through 14-N stays within the corresponding amounts of battery life allocated to tasks for the applications. More specifically, based on the monitored use of the applications 14-1 through 14-N and the corresponding battery consumption of the applications 14-1 through 14-N, the power management function 12 may update the estimated amounts of battery life for the tasks for applications 14-1 through 14-N to provide the corresponding desired amounts of usage. Then, if the updated, estimated battery life for the desired amount usage of a task for an application is greater than the allocated amount of battery life for that task, the usage of the application may be optimized in order to reduce power consumption by the application. By optimizing the usage, or power consumption, of the application, the power management function 12 can reduce the estimated battery life needed for the desired amount of usage of the application for the task to more closely match, and preferably be equal to or less than, the allocated amount of battery life for the task.

The manner in which an application is optimized may vary depending on the type of application. For example, a media player application may be optimized by reducing volume, reducing brightness of a display of the battery-operated device 10, turning off the display of the battery-operated device 10, reducing a bit rate or other quality parameter, or the like. As another example, a camera application may be optimized by controlling a quality level of captured images, turning off a flash of the camera application, or the like. In addition or alternatively, optimizations may be made to the operation of the battery-operated device 10 such as, for example, deactivating unused components of the battery-operated device 10. Using an Apple iPhone as an example, in order to optimize usage of the media player application, components of the Apple iPhone that are not used for the media player application (e.g., mobile telecommunications transceiver, Wireless Fidelity (WiFi) transceiver, etc.) may be deactivated or otherwise placed in a lower power state. Further, whether optimization is allowable, and if so, what types of optimizations are allowable may be user configurable.

Figure 3:
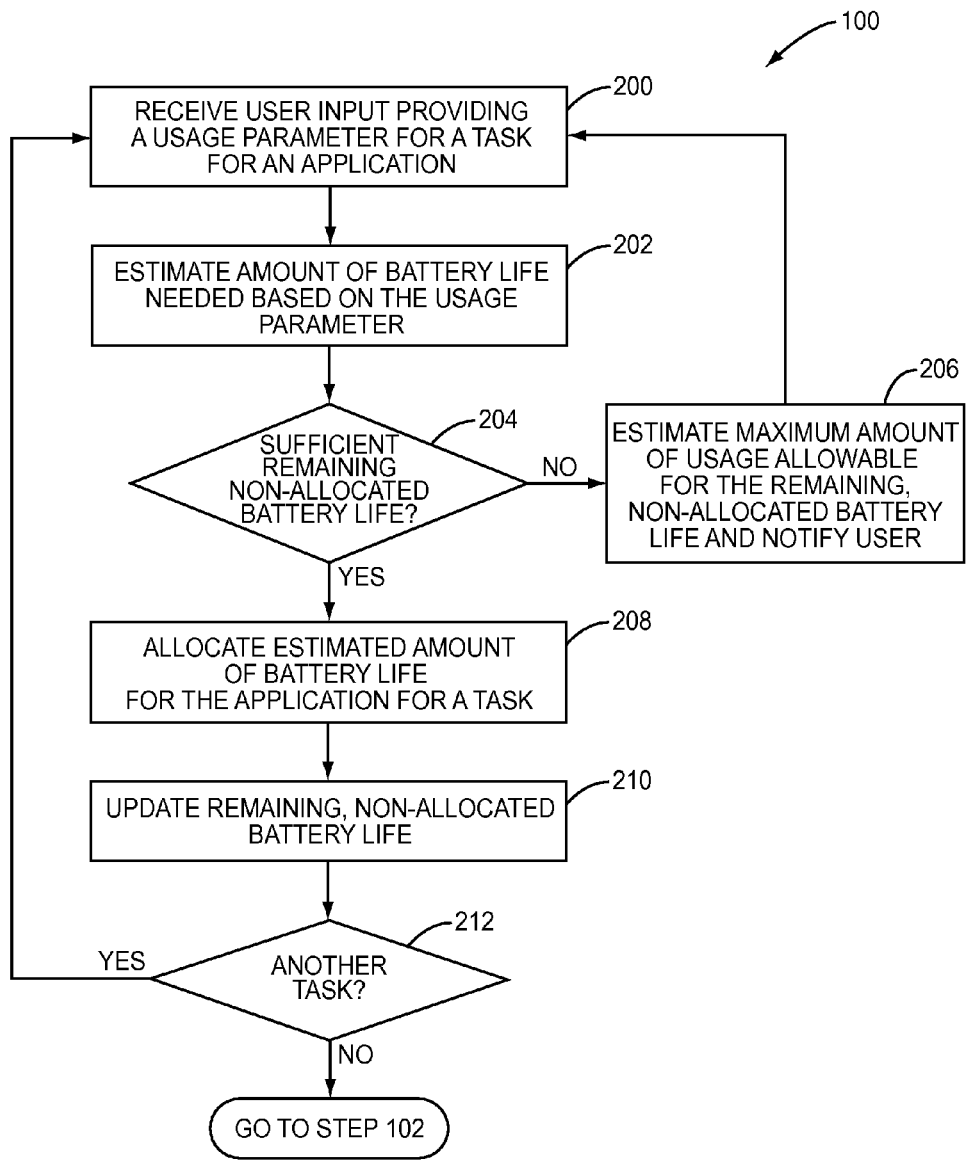
FIG. 3 is a more detailed illustration of one of the steps of FIG. 2 according to one embodiment of the present invention.

FIG. 3 is a more detailed flow chart of step 100 of FIG. 2 according to one embodiment of the present invention. First, the power management function 12 receives user input from the user 20 providing a usage parameter for a task for an application (i.e., one of the applications 14-1 through 14-N) (step 200). The user input may be input by the user 20 via a Graphical User Interface (GUI), as discussed below. Again, the usage parameter defines a desired amount of usage of the application. Next, the power management function 12 estimates an amount of battery life needed to provide the desired amount of usage for the application based on the usage parameter and a battery usage characteristic of the application (step 202). The battery usage characteristic may be a known characteristic of the application. This known battery characteristic may be updated based on actual usage of the application and corresponding battery consumption at the battery-operated device 10. In an alternative embodiment, the battery usage characteristic may be determined based on the actual usage of the application and corresponding battery usage at the battery-operated device 10. Note that the details of the battery usage characteristic may vary depending on the type of application. For example, the battery usage characteristic for a media player application may define an amount of battery usage per unit of time (e.g., per minute, per 10 minutes, or the like) when playing audio content such as, for example, songs or podcasts and an amount of battery usage per unit of time when playing video content such as music videos, movies, or television programs. As another example, the battery usage characteristic of a camera application may define an amount of battery usage per image capture for each of a number of image quality levels.

Once the amount of battery life needed is estimated, the power management function 12 determines whether there is sufficient remaining, non-allocated battery life available (step 204). If not, the power management function 12 estimates a maximum amount of usage or maximum usage parameter allowable for the application for the remaining, non-allocated battery life and notifies the user 20 (step 206). At this point, the process then returns to step 200. If there is sufficient remaining, non-allocated battery life, the power management function 12 allocates the estimated amount of battery life for the application for the task (step 208) and updates the remaining, non-allocated battery life to reflect the allocation of the estimated amount of battery life to the application for the task (step 210). The power management function 12 then determines whether the user 20 desires to define a usage parameter for another task of the same or a different application (step 212). If the user 20 desires to define a usage parameter for another task, then the process returns to step 200 where the user 20 defines a usage parameter for another task of the same or a different application. Once the user 20 has finished defining usage parameters, the process proceeds to step 102 (FIG. 2).

Figure 4A:
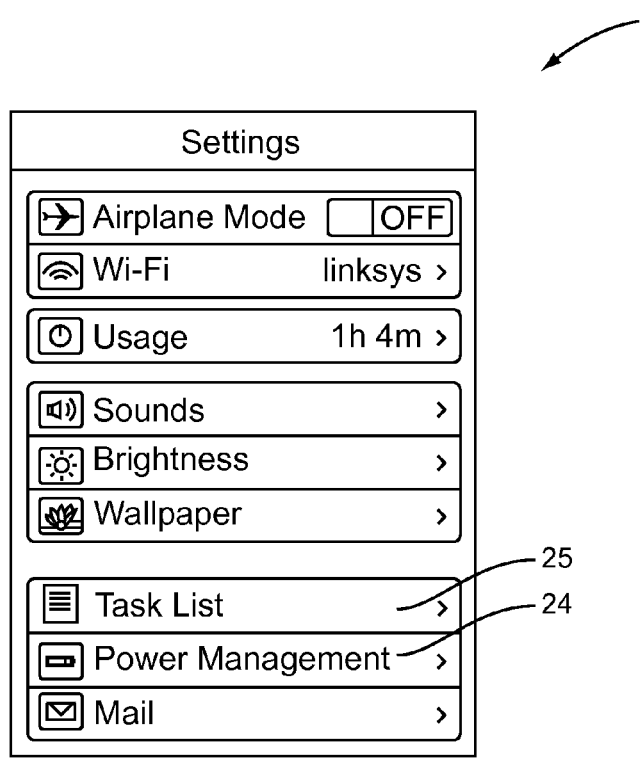
FIGS. 4A through 4E illustrate an exemplary Graphical User Interface (GUI) enabling a user to define usage parameters for tasks for a number of applications of a battery-operated device.

FIGS. 4A through 4E illustrate an exemplary Graphical User Interface (GUI) 22 enabling the user 20 to define usage parameters for tasks for a number of the applications 14-1 through 14-N according to one embodiment of the present invention. As illustrated in FIG. 4A, the user 20 may be enabled to access the power management function 12 by selecting a corresponding power management indicator 24 in a settings menu. As discussed below in detail, by selecting the power management indicator 24, the user 20 is enabled to define usage parameters for tasks for a number of applications. For each application, the user 20 may be enabled to define usage parameters for one or more tasks for the application. As discussed below, by selecting a task list indicator 25, the user 20 is enabled to view a list of tasks for which usage parameters have been defined for corresponding applications and prioritize those tasks.

Figure 4B:
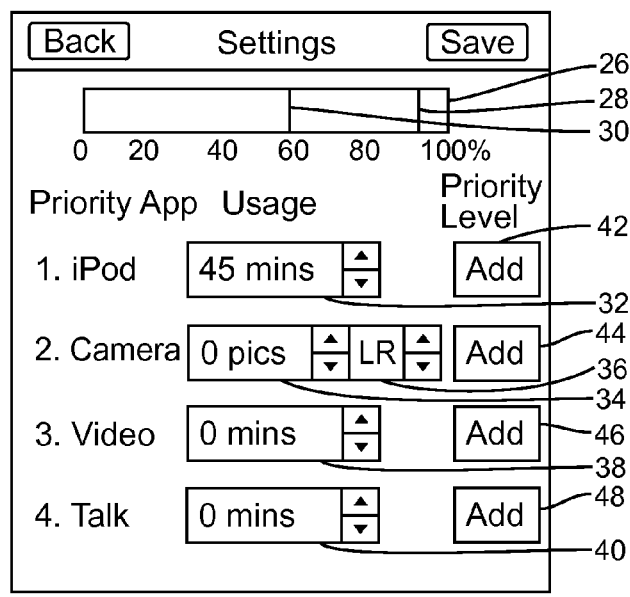

In response to the user 20 selecting the power management indicator 24, the GUI 22 then presents a power management screen to the user 20 as illustrated in FIG. 4B. The power management screen includes a battery life indicator 26. The battery life indicator 26 includes a current battery life indicator 28 that is indicative of a current, or remaining, battery life of the battery 16 (FIG. 1) of the battery-operated device 10. The battery life indicator 26 also includes a non-allocated battery life indicator 30 that is indicative of an amount of the battery life of the battery 16 that is currently non-allocated. The power management screen also includes a usage parameter field 32 for an "iPod" application, usage parameter fields 34 and 36 for a "camera" application, a usage parameter field 38 for a "video" application, a usage parameter field 40 for a "talk" or phone application, and a number of add buttons 42-48.

In this example, the user 20 first defines a usage parameter for the "iPod" application via the usage parameter field 32. The usage parameter for the "iPod" application is a number of minutes corresponding to a desired amount of playback time. In this example, the usage parameter defines the desired amount of playback time as 45 minutes. Once the user 20 has defined the usage parameter for the "iPod" application, the power management function 12 estimates an amount of battery life needed to provide 45 minutes of playback time for the "iPod" application. In this example, the estimated amount of battery life needed to provide 45 minutes of playback time for the "iPod" application is approximately 35% of the battery life. Since the current battery life indicator 28 is at approximately 95%, the non-allocated battery life indicator 30 is at approximately 60% (95%−35%). The user 20 then selects the add button 42 to add a task for the defined amount of usage of the "iPod" application.

Figure 4C:
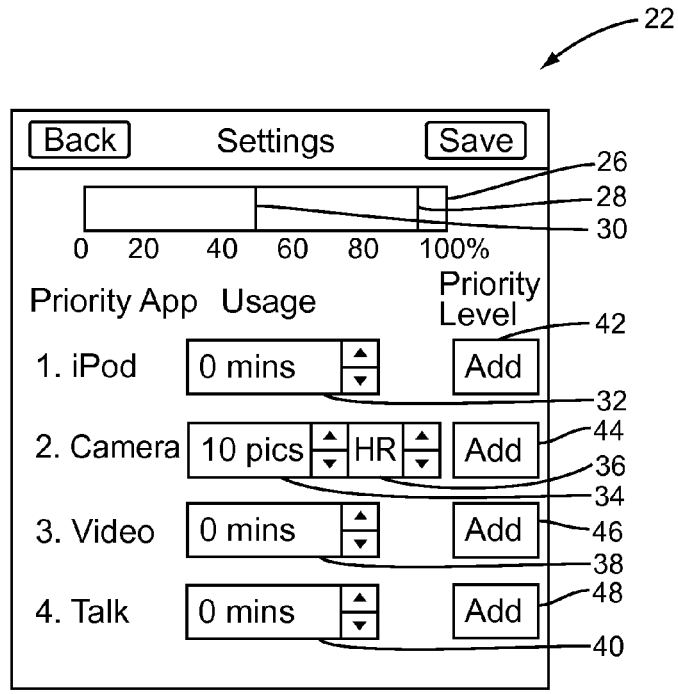

After selecting the add button 42, the power management screen is updated and, in this example, the user 20 then defines a usage parameter for the "camera" application via the usage parameter fields 34 and 36 as illustrated in FIG. 4C. The usage parameter for the "camera" application includes a number of pictures, which in this example is 10 pictures, and an image quality level, which in this example is high resolution (HR). As such, the desired amount of usage for the "camera" application is 10 pictures at high resolution. Once the user 20 has defined the usage parameter for the "camera" application, the power management function 12 estimates an amount of battery life needed to provide the desired amount of usage of the "camera" application. In this example, the amount of battery life needed is approximately 10%. As such, the non-allocated battery life indicator 30 is further reduced to approximately 50%. The user 20 then selects the add button 44 to add a task for the defined amount of usage of the "camera" application.

Figure 4D:
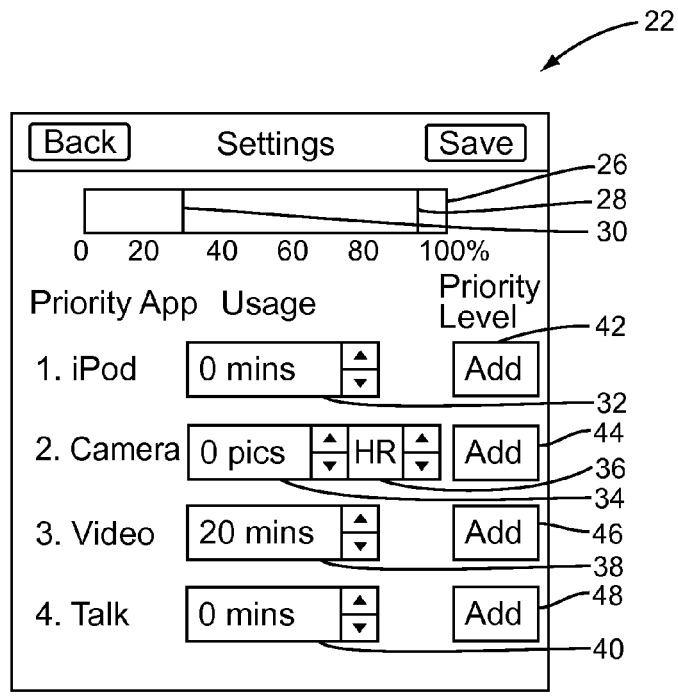

After selecting the add button 44, the power management screen is updated and, in this example, the user 20 then defines a usage parameter for the "video" application via a corresponding usage parameter field 38 as illustrated in FIG. 4D. The usage parameter for the "video" application includes a number of minutes corresponding to a desired amount of playback time for the "video" application, which in this example is 20 minutes. As such, the power management function 12 estimates an amount of battery life needed for 20 minutes of playback time for the "video" application, which in this example is approximately 15% of the battery life. Therefore, the non-allocated battery life indicator 30 is further reduced to approximately 35%. The user 20 then selects the add button 46 to add a task for the defined amount of usage of the "video" application.

Figure 4E:
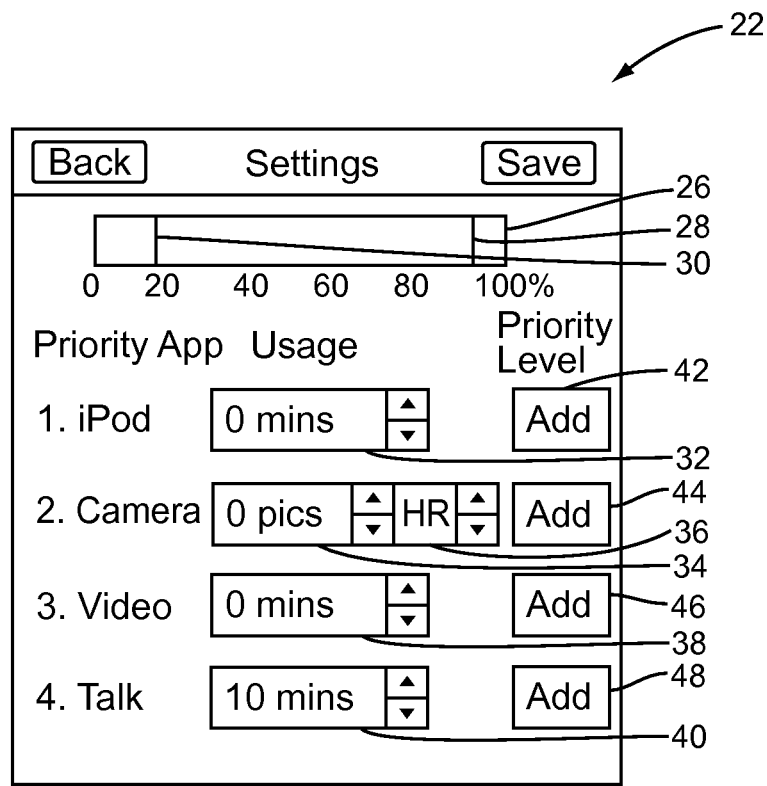

After selecting the add button 46, the power management screen is updated and in this example, the user 20 then defines a usage parameter for the "talk" application, or mobile phone application, via the usage parameter field 40 as illustrated in FIG. 4E. The usage parameter for the "talk" application includes a number of minutes corresponding to a desired amount of talk time, which in this example is 10 minutes. As such, the power management function 12 estimates an amount of battery life needed for 10 minutes of talk time, which in this example is approximately 20%. Therefore, the non-allocated battery life indicator 30 is further reduced to approximately 15%. The user 20 then selects the add button 48 to add a task for the defined amount of usage of the "talk" application. The user 20 may continue this process to define usage parameters for the applications for any number of desired tasks.

FIGS. 5A and 5B illustrate a task list screen 50 presented to the user 20 in response to selecting the task list indicator 25 of FIG. 4A. As illustrated, the task list screen 50 includes a back button 52 enabling the user 20 to navigate back to the menu of FIG. 4A, a save button 54 enabling the user 20 to save changes, and a task list 56. The task list 56 includes an entry for each task defined by the user 20. Each task corresponds to a desired amount of usage defined for a particular application. Zero, one, or multiple tasks may be defined for each of the applications. In this example, two tasks have been defined for the "iPod" application, two tasks have been defined for the "talk" application, one task has been defined for the "camera" application, and one task has been defined for the "video" application. In this embodiment, the ordering of the tasks in the task list 56 corresponds to priorities of the corresponding tasks. Further, in this embodiment, an indicator 58 may optionally be presented such that tasks below the indicator 58 are tasks that have been defined but for which there is not currently sufficient battery life. Further, the user 20 is enabled to move tasks up or down the task list 56 to change their priorities. In this example, the user 20 selects the task for the "talk" application having a priority of two (2) and moves the task up the task list 56 such that the priority is changes to one (1), as illustrated in FIG. 5B. The user 20 may then select the save button 54 to save the change.

Figure 6:
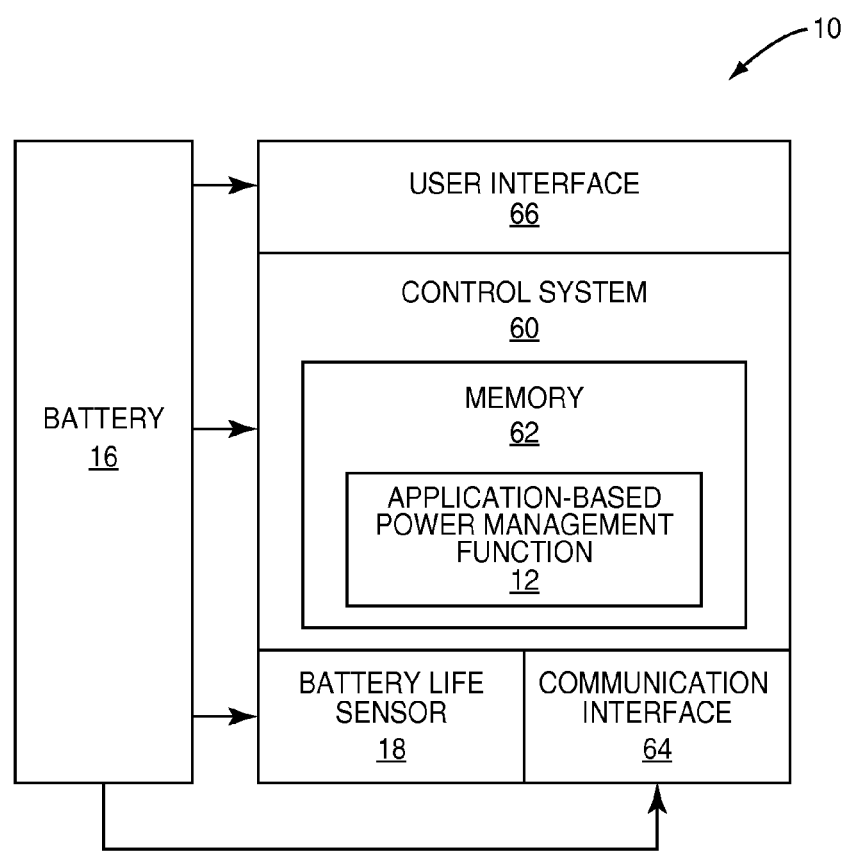
FIG. 6 is a block diagram of the battery-operated device of FIG. 1 according to one embodiment of the present invention.

FIG. 6 is a block diagram of the battery-operated device 10 of FIG. 1 according to one embodiment of the present invention. In general, the battery-operated device 10 includes a control system 60 having associated memory 62. In this example, the power management function 12 is implemented in software and stored in the memory 62. However, the present invention is not limited thereto. The power management function 12 may be implemented in software, hardware, or a combination thereof. The battery-operated device 10 may also include one or more communication interfaces 64 such as, for example, a mobile telecommunications interface, a local wireless interface (e.g., a WiFi interface, Bluetooth, or the like), a wired interface (e.g., USB, Firewire, or the like), or the like. The battery-operated device 10 also includes a user interface 66, which may include components such as a display, one or more user input devices, one or more speakers, one or more audio output connectors such as a headphone connector, or the like. The battery 16 provides power to the various components of the battery-operated device 10. The battery life sensor 18 operates to detect or otherwise determine the battery life of the battery 16.

Note that the applications 14-1 through 14-N (FIG. 1) typically involve at least some of the existing hardware of the battery-operated device 10 and some software stored in the memory 62. As such, the applications 14-1 through 14-N are not specifically illustrated in FIG. 6. As an example, a mobile telephone application may be provided by a mobile telecommunication interface included in the communication interfaces 64 and a microphone and speaker included in the user interface 66 under the control of the control system 60. As another example, a video player application may be provided by software and/or hardware included in the control system 60, a speaker included in the user interface 66, and a display included in the user interface 66.

Those skilled in the art will recognize improvements and modifications to the preferred embodiments of the present invention. All such improvements and modifications are considered within the scope of the concepts disclosed herein and the claims that follow.

What is claimed is:

1. A method of operating a battery-operated device enabling prioritization of battery usage for a plurality of tasks formed by one or more tasks for each application of a plurality of applications of the battery-operated device, the method comprising:

for each task of the one or more tasks for each application of the plurality of applications of the battery-operated device:
receiving, from a user of the battery-operated device, user input defining a usage parameter for the application for the task that corresponds to a desired amount of usage of the application for the task;
receiving a priority for the task;
determining an estimated amount of battery life of a battery of the battery-operated device that is sufficient to provide the desired amount of usage of the application for the task;
determining whether the estimated amount of battery life is available;
if the estimated amount of battery life is available, allocating an amount of battery life of the battery to the application for the task corresponding to the estimated amount of battery life;
if the estimated amount of battery life is not available, determining a maximum amount of usage of the application for the one or more tasks that is allowable for a currently remaining, non-allocated amount of battery life of the battery of the battery-operated device;

reducing the usage parameter for at least one of one or more tasks of the application;

notifying the user of the maximum amount of usage and wherein at least one of the preceding actions is performed on at least one electronic hardware component including at least one processor and memory containing software executable by the at least one processor whereby the at least one electronic hardware component is configured to perform the at least one of the preceding actions.

2. The method of claim 1 further comprising:
monitoring usage of battery life of the battery of the battery-operated device; and
taking an action based on monitoring the usage of the battery life.

3. The method of claim 1 further comprising, for each application of the plurality of applications:
monitoring usage of the application; and
notifying the user when the user has consumed the desired amount of usage of the application for the task.

4. The method of claim 3 wherein notifying the user comprises notifying the same user that prioritized the plurality of tasks.

5. The method of claim 1 further comprising, for each application of the plurality of applications:
monitoring usage of the application; and
notifying the user when the user has consumed the desired amount of usage of the application for the task and there is no remaining non-allocated battery life.

6. The method of claim 1 further comprising, for each application of the plurality of applications:
monitoring usage of the application; and
notifying the user when the user has consumed a threshold amount of the desired amount of usage of the application for the task.

7. The method of claim 1 further comprising, for each application of the plurality of applications:
monitoring usage of the application and a corresponding usage of battery life of the battery of the battery-operated device; and
notifying the user when the usage of the application is infringing on an amount of battery life allocated to a task for another application of the plurality of applications.

8. The method of claim 1 further comprising, for each application of the plurality of applications:
monitoring usage of the application and a corresponding usage of battery life of the battery of the battery-operated device; and
notifying the user when the usage of the application is about to infringe on an amount of battery life allocated to a task for another application of the plurality of applications.

9. The method of claim 1 wherein the battery-operated device comprises a second application for which an amount of battery life has not been allocated, and the method further comprises:
monitoring usage of the second application and a corresponding usage of battery life of the battery of the battery-operated device; and
notifying the user when the usage of the second application is infringing on an amount of battery life allocated to a task for one of the plurality of applications.

10. The method of claim 1 wherein the battery-operated device comprises a second application for which an amount of battery life has not been allocated, and the method further comprises:
monitoring usage of the second application and a corresponding usage of battery life of the battery of the battery-operated device; and
notifying the user when the usage of the second application is about to infringe on an amount of battery life allocated to a task for one of the plurality of applications.

11. The method of claim 1 further comprising, for each application of the plurality of applications:
monitoring usage of the application and a corresponding usage of battery life of the battery of the battery-operated device; and
notifying the user when the usage of the application is infringing on an amount of battery life allocated to a higher priority task.

12. The method of claim 1 further comprising, for each application of the plurality of applications:
monitoring usage of the application and a corresponding usage of battery life of the battery of the battery-operated device; and
notifying the user when the usage of the application is about to infringe on an amount of battery life allocated to a higher priority task.

13. The method of claim 1 further comprising, for each application of the plurality of applications:
monitoring usage of the application; and
automatically terminating the usage of the application when the user has consumed one of a group consisting of: the desired amount of usage of the application for one of the one or more tasks and a total desired amount of usage of the application for the one or more tasks.

14. The method of claim 1 further comprising, for each application of the plurality of applications:
monitoring usage of the application; and
automatically terminating the usage of the application when the user has consumed one of a group consisting of: the desired amount of usage of the application for one of the one or more tasks and a total desired amount of usage of the application for the one or more tasks, and there is no remaining non-allocated battery life.

15. The method of claim 1 further comprising, for each application of the plurality of applications:
monitoring usage of the application and a corresponding usage of battery life of the battery of the battery-operated device; and
automatically terminating the usage of the application when the usage of the application is infringing on an amount of battery life allocated to a task for another application of the plurality of applications.

16. The method of claim 1 further comprising, for each application of the plurality of applications:
monitoring usage of the application and a corresponding usage of battery life of the battery of the battery-operated device; and
automatically terminating the usage of the application when the usage of the application is about to infringe on an amount of battery life allocated to a task for another application of the plurality of applications.

17. The method of claim 1 further comprising, for each application of the plurality of applications:
monitoring usage of the application and a corresponding usage of battery life of the battery of the battery-operated device; and automatically terminating the usage of the application when the usage of the application is infringing on an amount of battery life allocated to a higher priority task for another application of the plurality of applications.

18. The method of claim 1 further comprising, for each application of the plurality of applications:
monitoring usage of the application and a corresponding usage of battery life of the battery of the battery-operated device; and
automatically terminating the usage of the application when the usage of the application is about to infringe on an amount of battery life allocated to a higher priority task for another application of the plurality of applications.

19. The method of claim 1 further comprising, for each application of the plurality of applications:
monitoring usage of the application and battery life consumed during the usage of the application;
updating the estimated amount of battery life that is sufficient to provide the desired amount of usage of the application for each of the one or more tasks for the application based on monitoring the usage of the application and the battery life consumed during the usage of the application; and
updating the amount of battery life allocated for each of the one or more tasks for the application to reflect the updating of the estimated amount of battery life.

20. The method of claim 1 further comprising, for each application of the plurality of applications:
monitoring usage of the application and battery life consumed during the usage of the application;
updating the estimated amount of battery life that is sufficient to provide the desired amount of usage of the application for each of the one or more tasks based on monitoring the usage of the application and the battery life consumed during the usage of the application to provide an updated estimated amount of battery life; and
optimizing the usage of the application if the updated estimated amount of battery life for at least one of the one or more tasks is greater than the amount of battery life allocated for the at least one of the one or more tasks for the application, such that battery life consumed for the desired amount of usage for the at least one of the one or more tasks for the application remains within the amount of battery life allocated for the at least one of the one or more tasks for the application.

21. The method of claim 1 wherein determining whether the estimated amount of battery life is available comprises determining whether the estimated amount of battery life is less than or equal to a remaining, non-allocated amount of battery life of the battery.

22. The method of claim 1 wherein the application is a phone application, and the usage parameter is a desired amount of talk time.

23. The method of claim 1 wherein the application is a media player application, and the usage parameter is a desired amount of playback time.

24. The method of claim 1 wherein the application is a media player application, and the usage parameter is a desired number of media items to play.

25. The method of claim 1 wherein the application is a camera application, and the usage parameter is a desired number of pictures.

26. The method of claim 1 wherein the application is a camera application, and the usage parameter is a desired number of pictures at a defined quality level.

27. The method of claim 1 wherein the application is a web application, and the usage parameter is a desired amount of connectivity.

28. The method of claim 1 wherein the plurality of applications are all applications of the battery-operated device.

29. The method of claim 1 wherein the plurality of applications are a subset of all applications of the battery-operated device.

30. The method of claim 1 wherein the user input comes from an end user of the battery-operated device.

31. A non-transitory computer readable medium storing software for instructing a control system of a battery-operated device to enable prioritization of battery usage for a plurality of tasks formed by one or more tasks for each application of a plurality of applications of the battery-operated device, the software for instructing the control system to:
for each task of one or more tasks for each application of a plurality of applications of the battery-operated device:
receive, from a user of the battery-operated device, user input defining a usage parameter for the application for the task that corresponds to a desired amount of usage of the application for the task;
receive a priority for the task;
determine an estimated amount of battery life of a battery of the battery-operated device that is sufficient to provide the desired amount of usage of the application for the task;
determine whether the estimated amount of battery life is available;
if the estimated amount of battery life is available, allocate an amount of battery life of the battery to the application for the task corresponding to the estimated amount of battery life;
if the estimated amount of battery life is not available, determine a maximum amount of usage of the application for the one or more tasks that is allowable for a currently remaining, non-allocated amount of battery life of the battery of the battery-operated device;
reduce the usage parameter for at least one of the one or more tasks for the application; and
notify the user of the maximum amount of usage.

32. A battery-operated device enabling prioritization of battery usage for a plurality of tasks formed by one or more tasks for each application of a plurality of applications of the battery-operated device, the battery-operated device comprising:
a battery sensor adapted to determine a battery life of a battery of the battery-operated device; and
a control system associated with the battery sensor and adapted to:
for each task of one or more tasks for each application of a plurality of applications of the battery-operated device:
receive, from a user of the battery-operated device, user input defining a usage parameter for the application for the task that corresponds to a desired amount of usage of the application for the task;
receive a priority for the task;
determine an estimated amount of battery life of the battery of the battery-operated device that is sufficient to provide the desired amount of usage of the application for the task;
determine whether the estimated amount of battery life is available;
if the estimated amount of battery life is available, allocate an amount of battery life of the battery to the application for the task corresponding to the estimated amount of battery life;
if the estimated amount of battery life is not available, determine a maximum amount of usage of the application for the one or more tasks that is allowable for a currently remaining, non-allocated amount of battery life of the battery of the battery-operated device;
reduce the usage parameter for at least one of the one or more tasks for the application; and
notify the user of the maximum amount of usage; and
wherein the control system is further adapted to enable the user to prioritize the plurality of tasks.

\* \* \* \* \*